United States Patent
Studenberg, Jr.

(10) Patent No.: US 7,308,046 B1
(45) Date of Patent: Dec. 11, 2007

(54) SYSTEM AND METHOD FOR DETECTING PRESENCE OF DIGITALLY MODULATED WAVEFORM

(75) Inventor: Frederick J. Studenberg, Jr., Melbourne, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 789 days.

(21) Appl. No.: 10/317,331

(22) Filed: Dec. 12, 2002

(51) Int. Cl.
*H03D 1/24* (2006.01)

(52) U.S. Cl. .................................................. 375/320

(58) Field of Classification Search ............... 375/320, 375/219, 221, 224, 228, 259, 260, 295, 316, 375/300, 340, 353, 377; 370/241, 310, 464; 455/73; 329/347, 348; 332/106, 149, 150; 340/870.01, 870.18
See application file for complete search history.

(56) References Cited

U.S. PATENT DOCUMENTS 5,640,423 A * 6/1997 Archer ....................... 375/261

* cited by examiner

*Primary Examiner*—Pankaj Kumar
(74) *Attorney, Agent, or Firm*—Nathan O. Jensen; Kyle Eppele

(57) ABSTRACT

The disclosure is directed to a system for detecting digitally modulated waveforms on a transmission channel. The system includes an amplitude modulation detector configured to detect amplitude variations on the transmission channel. The system also includes a first bandpass filter configured to receive a signal from the amplitude modulation detector monitoring the transmission channel and tuned to a wavelength corresponding to the symbol rate of the digitally modulated waveform to be detected. Further, the system includes a second bandpass filter configured to receive the signal from the amplitude modulation detector monitoring the transmission channel and tuned to a second wavelength. Further still, the system includes a means for comparing the output of the first and second bandpass filters to determine the presence of a digitally modulated waveform.

20 Claims, 3 Drawing Sheets

SYSTEM AND METHOD FOR DETECTING PRESENCE OF DIGITALLY MODULATED WAVEFORM

BACKGROUND OF THE INVENTION

The present application relates generally to the field of datalink communications. More particularly, the application relates to a system and method to detect the presence of a digitally modulated waveform on a transmission channel.

Very High Frequency Digital Link (VDL) Mode 2 is a type of datalink communication system used in Aeronautical communication systems. VDL Mode 2 is used to improve air traffic management, leading to improved operational efficiency among other improvements, in the aircraft industry.

VDL Mode 2 is a carrier sense multiple access (CSMA) packet data system. CSMA is an access technique that requires a user check the transport medium using a listen function prior to transmitting. If the transport medium is busy, the user is required to hold for a period of time prior to reinitiating a transmitting function. If two stations transmit simultaneously on the transport medium, the resultant collision can corrupt both messages. Further, the physical layer of VDL Mode 2 further utilizes a 31.5 kilobits per second data rate Differential Phase Shift Keying (D8PSK) digital waveform using raised cosine filtering with 0.6 excess bandwidth.

Accordingly, VDL Mode 2 allows more available bandwidth by providing a faster and more reliable transmission speed while also enhancing communications with flight controllers and pilots.

However, to implement the CSMA access technique, it is necessary to prevent unintentional transmissions by determining channel activity. To prevent unintentional transmissions, the energy level of the channel is checked in decibels (dBm) or microvolts. An energy level threshold, used to prevent the collision of messages, has been set by the Radio Technical Commission for Aeronautics (RTCA). If the channel is above a certain energy level threshold, currently approximately −87 dBm, the channel is considered busy and the user must delay transmitting until the channel is clear. If the channel energy level is below the threshold, the user is free to transmit.

Traditionally, the energy level of the channel has been monitored by examining the automatic gain control (AGC) level of a receiver monitoring the channel. The AGC level is determined by monitoring the automatic gain control response on a receiver. However, the AGC level is responsive to any kind of energy on the channel, whether the source is a VDL Mode 2 signal, an unmodulated carrier, or other interference. Accordingly, monitoring the AGC level can create many false positives when detecting the presence of a VDL Mode 2 signal. False positives can degrade network efficiency and cause system indications to an operator of no communications.

Therefore, there is a need for a system and method for monitoring a communication channel and to distinguish a desired type of modulated waveform from ambient interference sources and to prevent false positives. There is also a need for a system and method for monitoring a communication channel carrying VDL Mode 2 signals to detect the presence of VDL Mode 2 signals and distinguish the signals from ambient interference sources to prevent false positives.

SUMMARY OF THE INVENTION

One exemplary embodiment of the invention relates to a system for detecting the presence of a digitally modulated waveform on a transmission channel. The system includes an amplitude modulation detector configured to detect a change in the energy level of the transmission channel, a first bandpass filter configured to receive a signal from the transmission channel and tuned to a wavelength corresponding to the symbol rate of the digitally modulated waveform to be detected, a second bandpass filter configured to receive the signal from the transmission channel and tuned to a second wavelength, and means for comparing the output of the first and second bandpass filters to determine the presence of a digitally modulated waveform.

Another exemplary embodiment of the invention relates to a VHF communications transceiver having an improved transmission throughput. The communications transceiver includes a first antenna for monitoring a transmission channel, a second antenna for sending a signal over a transmission channel, and a system for detecting the presence of a digitally modulated waveform on the transmission channel. The system includes an amplitude modulation detector configured to detect a change in the energy level of the transmission channel, a first bandpass filter configured to receive a signal from the transmission channel and tuned to a wavelength corresponding to the symbol rate of the digitally modulated waveform to be detected, a second bandpass filter configured to receive the signal from the transmission channel and tuned to a second wavelength, and means for comparing the output of the first and second bandpass filters to determine the presence of a digitally modulated waveform.

Yet, another exemplary embodiment of the invention relates to a method for detecting the presence of a digitally modulated waveform on a transmission channel prior to transmitting a signal. The method includes monitoring a transmission channel to detect a change in energy level, performing a first filtering of a signal from the transmission channel at a first wavelength corresponding to the symbol rate of the digitally modulated waveform to be detected, performing a second filtering of the signal from the transmission channel at a second wavelength to provide a control value, and comparing the output from the first and second filtering to determine the presence of a digitally modulated waveform.

BRIEF DESCRIPTION OF THE DRAWINGS

The invention will become more fully understood from the following detailed description, taken in conjunction with the accompanying drawings, wherein like reference numerals refer to like elements, and in which.

DETAILED DESCRIPTION OF THE-PREFERRED EMBODIMENTS

Figure 1:
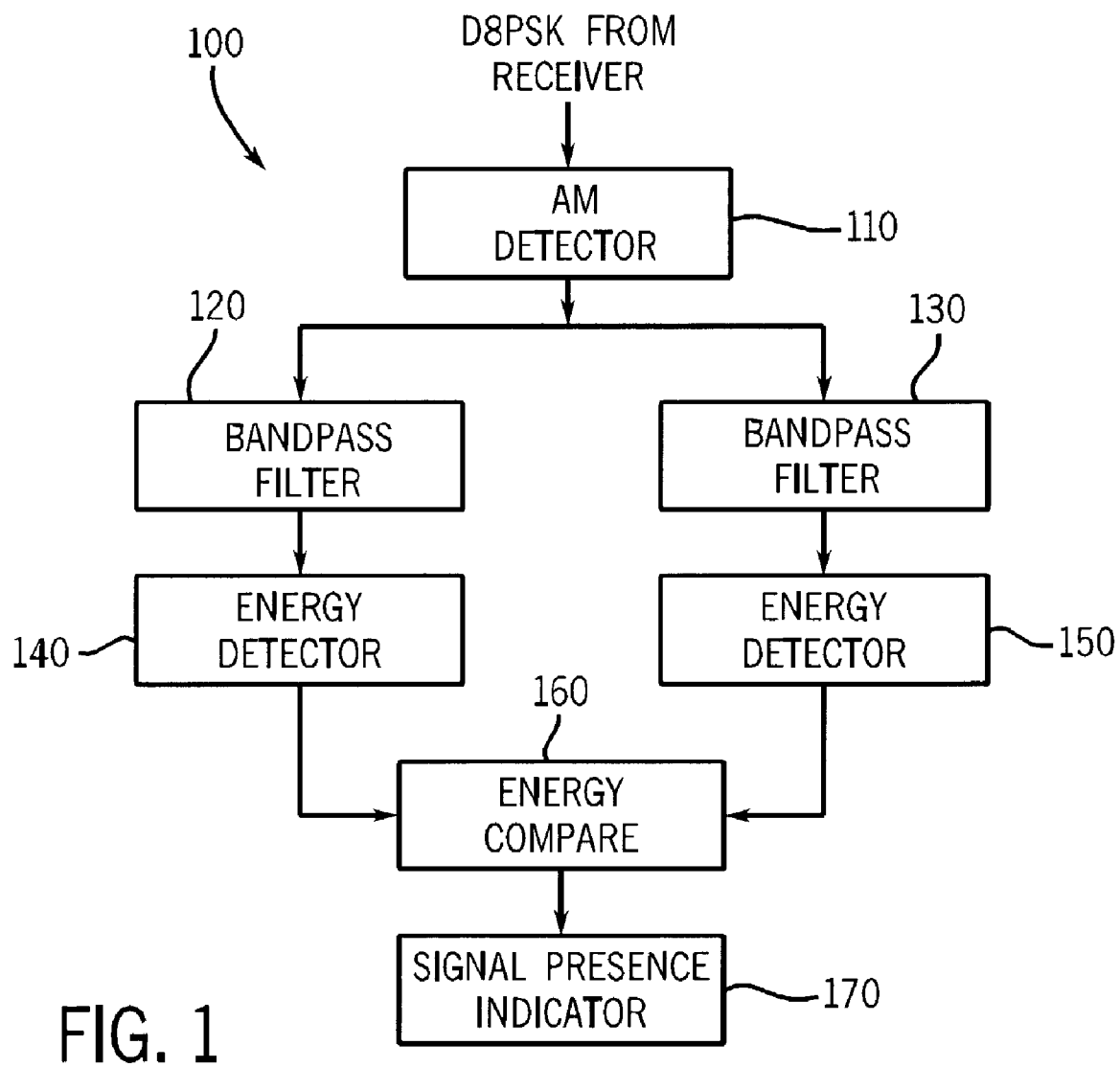
FIG. 1 is a schematic diagram illustrating a system 100 for detecting the presence of a VDL Mode 2 signal according to an exemplary embodiment.

FIG. 1 is a schematic diagram illustrating a system 100 for detecting the presence of a VDL Mode 2 signal according to an exemplary embodiment. The system can include an amplitude modulated(AM) detector 110, a first bandpass filter 120, a second bandpass filter 130, a first energy detector 140, a second energy detector 150, an energy compare component 160, and a signal presence indicator 170.

According to an exemplary embodiment, AM detector 110 can be an envelope detector. An envelope detector can be used to measure or detect the amplitude (as opposed to the power or phase) of a digitally modulated waveform. According to an exemplary embodiment, AM detector 110 can be a halfwave rectifier which charges a capacitor to a voltage approximately equal to the peak voltage of the incoming AM waveform. When the input wave's amplitude increases, the capacitor voltage is increased via the rectifying diode. When the input's amplitude falls, the capacitor voltage is reduced by being discharged by a 'bleed' resistor.

AM detector 110 is used to detect the energy level on the transmission channel. Wherein the energy level is detected to have an energy level higher than the threshold level set by transmission system protocols, a determination must be made whether a VDL Mode 2 signal is present or whether the increased energy level is caused by interference.

Accordingly, prior to transmitting, the signal on the transmission line is provided as uniform inputs to first bandpass filter 120 and second bandpass filer 130. First bandpass filter 120 and second bandpass filter 130 can be electronic devices or circuits that allow signals between two specific frequencies to pass, but discriminate against signals at other frequencies. The main function of such a filter in a transmitter is to limit the bandwidth of the output signal to the minimum necessary to convey data at the desired speed and in the desired form. In a receiver, a bandpass filter allows signals within a selected range of frequencies to be heard or decoded, while preventing signals at unwanted frequencies from getting through. A bandpass filter can also optimize the signal-to-noise ratio (sensitivity) of a receiver.

According to an exemplary embodiment, first bandpass filter 120 can be tuned to 10.5 kHz and second bandpass filter 130 can be tuned to 9.5 kHz. Although 9.5 kHz is described in the exemplary embodiment, second bandpass filter 130 can be tuned to any adjacent band near the band prescribed for the first bandpass filter. The 3 dB bandwidth of each filter is a nominal 500 Hz with a nominal 20 dB rejection and +/−1000 Hz. The 3 dB bandwidth was chosen to minimize time delay through the filter consistent with detection times and ability to reject adjacent bandpass filter energy.

According to an exemplary embodiment, 10.5 kHz can be chosen as the filter band for first band based on the existence of a detectable spectral line at that bandwidth wherein a VDL Mode 2 signal is detected. The spectral line correlates to the natural symbol rate found in the signal. The natural symbol rate is the rate at which data is encoded for transmission. This spectral line is present on the output of an AM demodulator. It is caused by an inherent amplitude modulation component of the D8PSK waveform. The spectral line will not be present in phase or frequency demodulation of the D8PSK waveform, the demodulation method used to recover message content.

The output from first bandpass filter 120 can be provided to first energy detector 140 and the output from second bandpass filter 130 can be provided to second energy detector 150 according to an exemplary embodiment. The first and second energy detectors can be used to determine the energy level of the signal received from the first and second bandpass filter.

The output from first energy detector 140 and second energy detector 150 is provided as inputs to energy compare 160. Energy compare 160 can be any form of level comparator, such as but not limited to an operational amplifier or other specialized equipment such as dual analog-to-digital converters coupled to a processor, to compare levels. According to an exemplary embodiment, the energy output from energy detector 140 is compared to the energy output from energy detector 150 as a ratio. If the ratio of the outputs exceeds a preset level, presence of a VDL Mode 2 signal is indicated using signal presence indicator 170. Signal presence indicator 170 can be a data instruction, a mechanical indicator, a signal or any other type of indicia for communicating the presence of a VDL Mode 2 signal.

In operation, according to an exemplary embodiment, VDL Mode 2 signals include a low detectable spectral line at 10.5 KHz. When a VDL Mode 2 signal is present, the energy level output from the first bandpass filter (e.g. filter 120), will be higher in comparison to the energy level output from the second bandpass filter (e.g. filter 130). The resultant ratio will indicate the presence of a VDL Mode 2 signal and signal presence indicator 170 can be used to indicate the ability to initiate transmission.

If the monitored energy level on the channel changes as a result of noise, there will be minimal, if any, difference between the energy level measured from first bandpass filter 120 and second bandpass filter 130. Accordingly, no VDL Mode 2 signal is detected and a new VDL Mode 2 signal can be transmitted with reduced chance for collision and corruption of the signal.

Figure 2A:
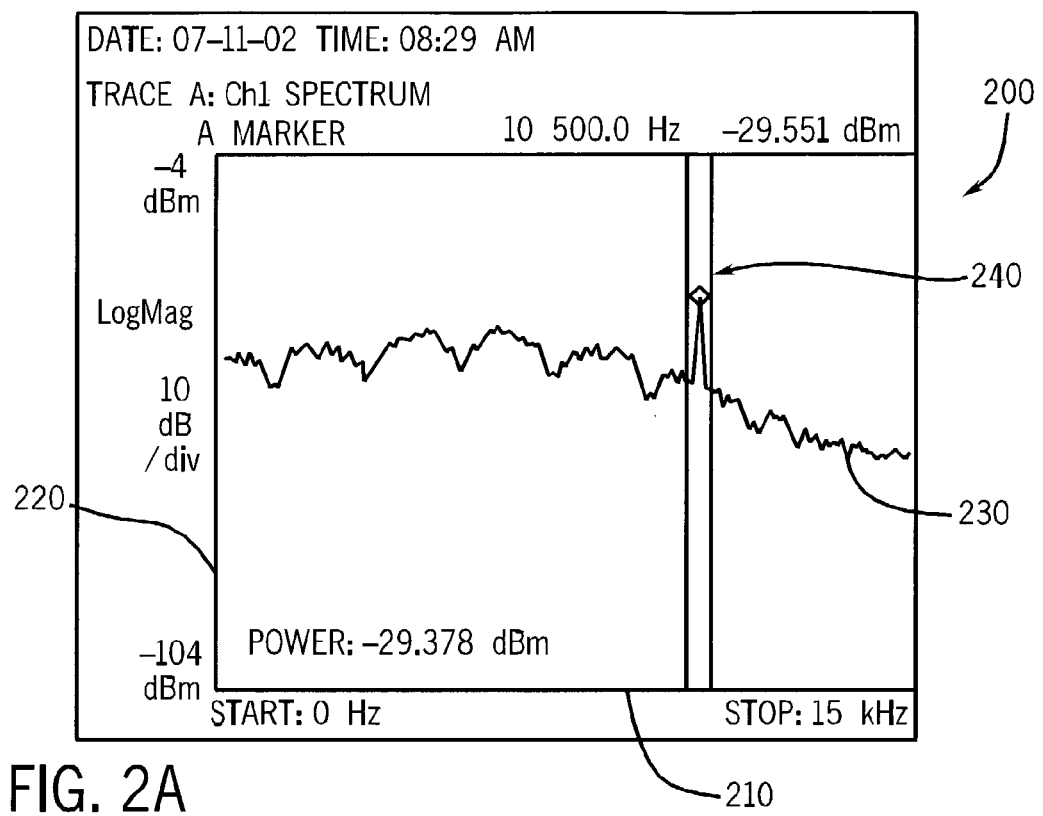
FIG. 2 is a graph showing the spectral line found in the VDL Mode 2 waveform at 10.5 kHz.

FIG. 2A is a graph 200 showing a spectral readout of the energy output from an AM detector when presented with a pseudo-random combination of D8PSK data. A horizontal axis 210 shows frequency from 0 Hz to 15 KHz. A vertical axis 220 indicates relative amplitude. A spectral line of energy 230 is displayed in the graph. Spectral line of energy 230 shows a spike at the approximately 10.5 kHz band 240, indicative of the presence of a VDL Mode 2 waveform.

Figure 2B:
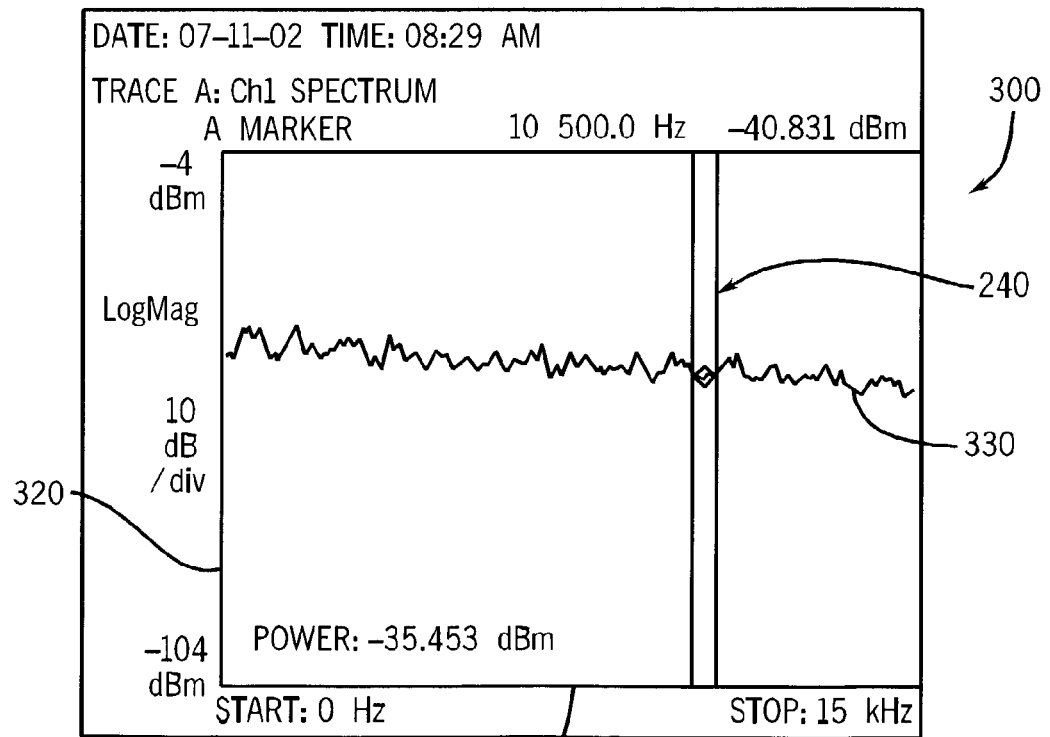

FIG. 2B is also a graph 300 showing a spectral readout of the energy output from a FM/PM detector when presented with a pseudo-random combination of D8PSK data. A horizontal axis 310 shows frequency from 0 Hz to 15 KHz. A vertical axis 320 indicates relative amplitude. A spectral line of energy 330 is displayed in the graph. Spectral line of energy 330 does not show any spike at the approximately 10.5 kHz band 240 or other indication to indicate of the presence of a VDL Mode 2 waveform.

Figure 3:
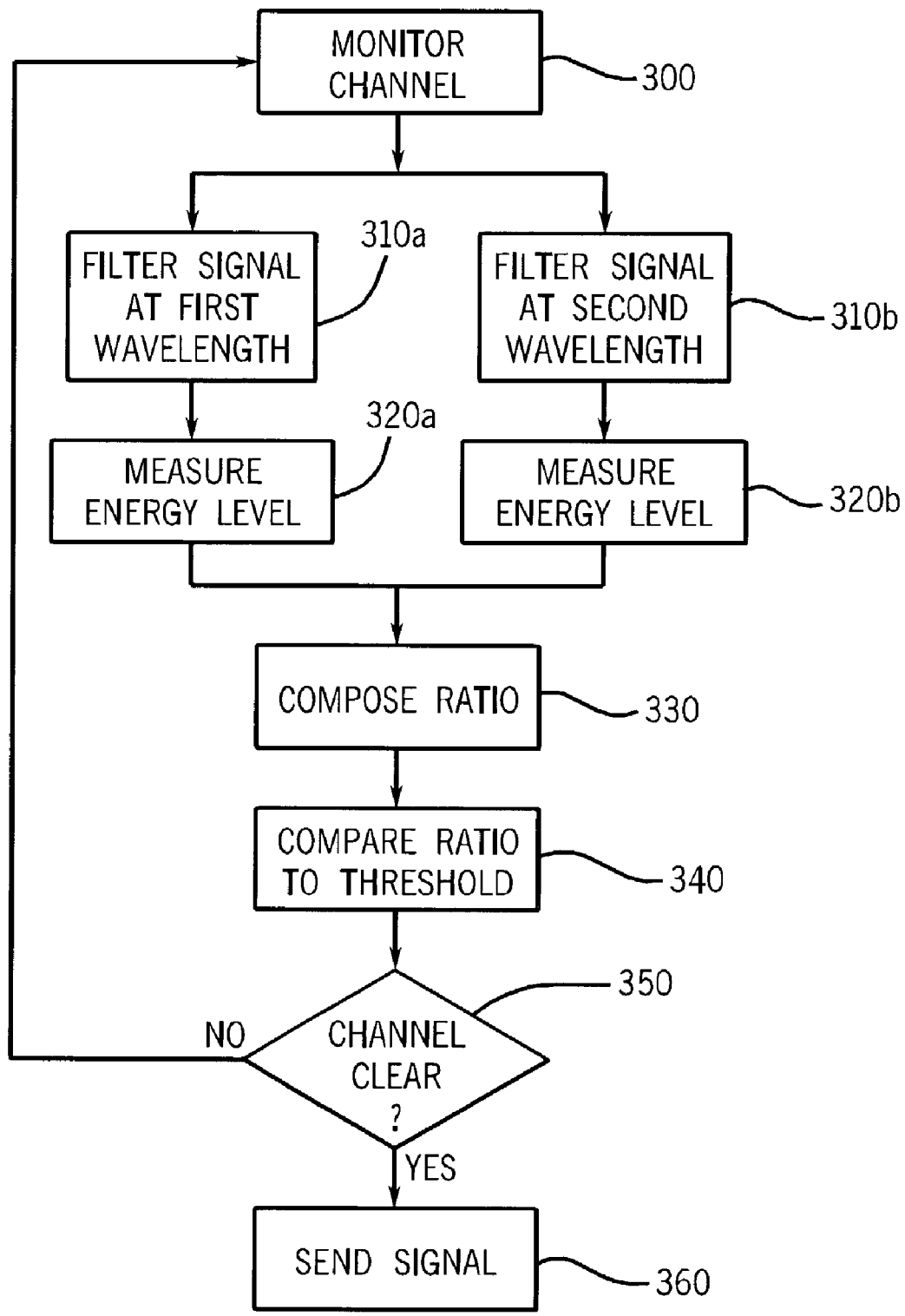
FIG. 3 is a flowchart illustrating a method for detecting the presence of a VDL Mode 2 waveform.

FIG. 3 is a flowchart illustrating a method for sending a VDL Mode 2 signal after detecting the presence of a pre-existing VDL Mode 2 signal using the system described above with reference to FIG. 1 according to an exemplary embodiment.

Prior to sending a VDL Mode 2 signal, the transmission channel must first be monitored to detect the presence of a preexisting VDL Mode 2 signal. The transmission channel can be monitored using a receiver including automatic gain control (step 300). Automatic gain control functions to indicate the presence of energy on the transmission channel. If energy is detected on the channel, the signal on the channel can be sampled to determine if the energy is the result of a VDL Mode 2 signal or of an interference noise.

The signal from the channel can be provided to first and second bandpass filters (steps 310*a* and 310*b*). The signal is provided to a first bandpass filter tuned to 10.5 kHz according to an exemplary embodiment (step 310*a*). The first bandpass filter can be tuned to 10.5 kHz based on the empirical knowledge that a VDL Mode 2 signal will cause a spectral response at 10.5 kHz based on the symbol rate of the signal. According to alternative embodiments, where the system can be used to detect the presence of other types of digitally modulated signals, the first bandpass filter can be tuned according to the symbol rate of those signals.

The signal is provided to a second bandpass filter (step 310b). The second bandpass filter can be tuned to 9.5 kHz according to an exemplary embodiment. According to alternative embodiments, the second bandpass filter can be set to any wavelength wherein a signal is detected but not affected by the spectral response near 10.5 kHz or the symbol rate of other types of digitally modulated signals. The second bandpass filter can provide a baseline energy level measurement for comparison with the first bandpass filter.

The output from steps 310a and 310b can be measured to determine the energy level of the signal after passing through the first and second bandpass filters (steps 320a and 320b).

The output of steps 320a and 320b can be used to compose a ratio (step 330). The ratio will compare the energy level of the signal at a wavelength where a spectral response is expected if a VDL Mode 2 signal is present to the energy level of the signal at a wavelength where no variation based on the presence of a VDL Mode 2 signal is expected.

The ratio is compared to a predetermined threshold ratio to determine the presence of a signal (step 340). If no signal is present, the energy level of the signal at a wavelength, where a spectral response is expected, can be approximately equivalent to the energy level of the signal at a wavelength where there is no variation based on the presence of a VDL Mode 2 signal. If a VDL Mode 2 signal is present, the energy level of the signal at a wavelength where a spectral response is expected can be greater than the energy level of the signal at a wavelength where there is no variation based on the presence of a VDL Mode 2 signal.

A determination is made based on step 340 whether a VDL Mode 2 signal is present (step 350). If a signal is not detected, a new VDL Mode 2 signal can be transmitted (step 360). If a signal is detected, the method can cycle back to perform step 310.

While the exemplary embodiments illustrated in the FIGURES and described above are presently preferred, it should be understood that these embodiments are offered by way of example only. For example, alternative embodiments include using the above described system and method with other types of digitally modulated waveforms. According to another alternative embodiment the bandpass filters can be tuned to correspond with a different symbol rate. Further, the methods disclosed may be performed in any of a variety of sequence of steps. Accordingly, the present invention is not limited to a particular embodiment, but extends to various modifications that nevertheless fall within the scope of the appended claims.

What is claimed is:

1. A system for detecting the presence of a digitally modulated waveform on a transmission channel, comprising:
   an amplitude modulation detector configured to detect amplitude variations on the transmission channel;
   a first filter configured to receive a signal from the amplitude modulation detector monitoring the transmission channel and tuned to a frequency corresponding to a symbol rate of the digitally modulated waveform to be detected;
   a second filter configured to receive the signal from the amplitude modulation detector monitoring the transmission channel and tuned to a second frequency; and
   means for comparing output of the first and second filters to determine the presence of a digitally modulated waveform.

2. The system of claim 1, wherein the digitally modulated signal is a VDL Mode 2 signal.

3. The system of claim 2, wherein the first filter is tuned to approximately 10.5 kHz.

4. The system of claim 3, wherein the second filter is tuned to approximately 9.5 kHz.

5. The system of claim 1, wherein the first and second filters are bandpass filter and wherein the means for comparing the output of the first and second bandpass filters to determine the presence of a digitally modulated waveform includes first and second energy level detectors.

6. The system of claim 5, wherein the means for comparing the output of the first and second bandpass filters to determine the presence of a digitally modulated waveform further includes a means for generating a ratio comparing the output of the first bandpass filter to the output of the second bandpass filter.

7. The system of claim 1, wherein the first and second filters are bandpass filter and wherein the means for comparing the output of the first and second bandpass filters to determine the presence of a digitally modulated waveform includes first and second analog-to-digital converters coupled to a processor.

8. A VHF communications transceiver having an improved transmission throughput, comprising:
   a first antenna for monitoring a transmission channel;
   a second antenna for sending a signal over a transmission channel;
   an amplitude modulation detector configured to detect a change in an energy level of the transmission channel;
   a first bandpass filter configured to receive a signal from the amplitude modulation detector monitoring the transmission channel and tuned to a frequency corresponding to a symbol rate of the digitally modulated waveform to be detected;
   a second bandpass filter configured to receive the signal from the amplitude modulation detector monitoring the transmission channel and tuned to a second frequency; and
   a computer configured to compare output of the first and second bandpass filters to determine the presence of a digitally modulated waveform.

9. The VHF communications transceiver of claim 8, wherein the digitally modulated signal is a VDL Mode 2 signal.

10. The VHF communications transceiver of claim 9, wherein the first bandpass filter is tuned to approximately 10.5 kHz.

11. The VHF communications transceiver of claim 10, wherein the second bandpass filter is tuned to approximately 9.5 kHz.

12. The VHF communications transceiver of claim 8, wherein the means for comparing the output of the first and second bandpass filters to determine the presence of a digitally modulated waveform includes first and second energy level detectors.

13. The VHF communications transceiver of claim 12, wherein the means for comparing the output of the first and second bandpass filters to determine the presence of a digitally modulated waveform further includes a means for generating a ratio comparing the output of the first bandpass filter to the output of the second bandpass filter.

14. The VHF communications transceiver of claim 8, wherein the means for comparing the output of the first and second bandpass filters to determine the presence of a digitally modulated waveform includes providing the output of the first and second bandpass filters respectively into first and second analog-to digital converters coupled to a processor.

15. A method for detecting the presence of a digitally modulated waveform on a transmission channel prior to transmitting a signal, comprising:
- monitoring a transmission channel to detect a change in energy level;
- performing a first filtering of a signal from an amplitude modulation detector monitoring the transmission channel at a first frequency corresponding to a symbol rate of the digitally modulated waveform to be detected;
- performing a second filtering of the signal from the amplitude modulation detector monitoring the transmission channel at a second frequency to provide a control value; and
- comparing output from the first and second filtering to determine a presence of a digitally modulated waveform.

16. The method of claim 15, wherein the digitally modulated waveform is a VDL Mode 2 signal.

17. The method of claim 16, wherein the first filtering is performed at 10.5 kHz.

18. The method of claim 17, wherein the second filtering is performed at 9.5 kHz.

19. The method of claim 15, wherein the step of comparing the output from the first and second filtering to determine the presence of a digitally modulated waveform includes:
- providing output from the first filtering to a first analog-to-digital converter coupled to a processor, and
- providing output from the second filtering to a second analog-to-digital converter coupled to the processor.

20. The method of claim 15, further comprising providing a signal on the transmission channel based on the comparison of the first and second filtering.

* * * * *